United States Patent
Kominato et al.

(10) Patent No.: US 9,664,997 B2
(45) Date of Patent: May 30, 2017

(54) METHOD OF MANUFACTURING MASK BLANK AND METHOD OF MANUFACTURING TRANSFER MASK

(71) Applicant: HOYA CORPORATION, Tokyo (JP)

(72) Inventors: Atsushi Kominato, Tokyo (JP); Hiroaki Shishido, Tokyo (JP); Osamu Nozawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 0 days.

(21) Appl. No.: 14/440,661

(22) PCT Filed: Oct. 24, 2013

(86) PCT No.: PCT/JP2013/078861
§ 371 (c)(1),
(2) Date: May 5, 2015

(87) PCT Pub. No.: WO2014/073389
PCT Pub. Date: May 15, 2014

(65) Prior Publication Data
US 2015/0331311 A1    Nov. 19, 2015

(30) Foreign Application Priority Data

Nov. 8, 2012  (JP) ................. 2012-245957

(51) Int. Cl.
*G03F 1/50*    (2012.01)
*G03F 1/60*    (2012.01)
*C23C 14/06*   (2006.01)
*C03C 17/22*   (2006.01)
*C03C 17/34*   (2006.01)

(52) U.S. Cl.
CPC ............. *G03F 1/50* (2013.01); *C03C 17/225* (2013.01); *C03C 17/3435* (2013.01); *C23C 14/0641* (2013.01); *G03F 1/60* (2013.01); *C03C 2217/281* (2013.01); *C03C 2218/33* (2013.01)

(58) Field of Classification Search
CPC ......... G03F 1/50; G03F 1/60; C23C 14/0641; C23C 17/225; C23C 17/3435
USPC ......................................... 430/5
See application file for complete search history.

(56) References Cited

U.S. PATENT DOCUMENTS

| | | |
|---|---|---|
| 6,499,317 B1 | 12/2002 | Ikuta et al. |
| 6,723,477 B2 | 4/2004 | Nozawa et al. |
| 7,195,846 B2 | 3/2007 | Kaneko et al. |
| 7,585,598 B2 | 9/2009 | Maida et al. |
| 7,635,658 B2 | 12/2009 | Bookbinder et al. |
| 8,168,351 B2 | 5/2012 | Inazuki et al. |
| 8,820,122 B2 | 9/2014 | Maida et al. |
| 2013/0071777 A1 | 3/2013 | Nozawa et al. |

FOREIGN PATENT DOCUMENTS

| | | |
|---|---|---|
| JP | 2002-162726 A | 6/2002 |
| JP | 2004-199035 A | 7/2004 |
| JP | 2005-298330 A | 10/2005 |
| JP | 2007-182367 A | 7/2007 |
| JP | 2009-514774 A | 4/2009 |
| JP | 2010-237502 A | 10/2010 |
| JP | 2012-72053 A | 4/2012 |
| TW | 201142486 A1 | 12/2011 |

OTHER PUBLICATIONS

International Search Report of PCT/JP2013/078861, dated Nov. 26, 2013. [PCT/ISA/210].
Notification of Reasons for Refusal dated Dec. 14, 2016, issued by the Taiwan Intellectual Property Office in counterpart Taiwanese Application No. 102139423.

*Primary Examiner* — Christopher Young
(74) *Attorney, Agent, or Firm* — Sughrue Mion, PLLC

(57) ABSTRACT

Methods of manufacturing a mask blank and a transfer mask that reduce internal stress of a thin film. The methods include preparing a transparent substrate having a pair of opposing main surfaces and composed of a glass material having a hydrogen content of less than 7.4×1018 molecules/cm3, forming a thin film composed of a material containing silicon or metal on one of the main surfaces of the transparent substrate, and carrying out heating treatment or photo irradiation treatment on the transparent substrate with the thin film. The absolute value of a variation of flatness in a predetermined region, as calculated based on a difference in shape obtained from a shape of a main surface of the transparent substrate prior to forming the thin film and a shape of a main surface of the substrate exposed after removing the thin film, is not more than 100 nm.

9 Claims, 1 Drawing Sheet

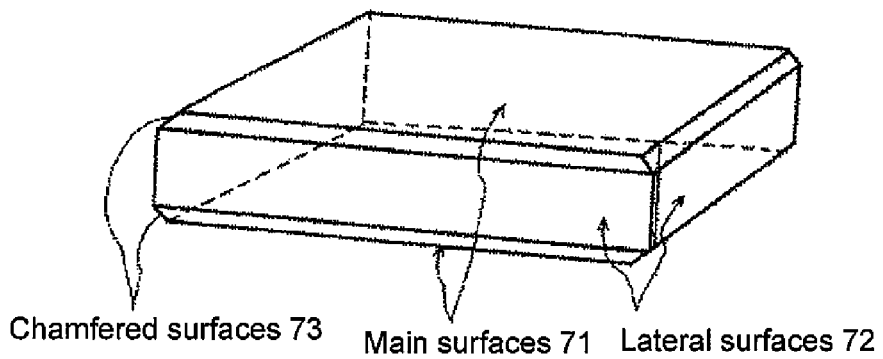

METHOD OF MANUFACTURING MASK BLANK AND METHOD OF MANUFACTURING TRANSFER MASK

CROSS REFERENCE TO RELATED APPLICATIONS

This application is a National Stage of International Application No. PCT/JP2013/078861 filed Oct. 24, 2013, claiming priority based on Japanese Patent Application No. 2012-245957, filed Nov. 8, 2012, the contents of all of which are incorporated herein by reference in their entirety.

TECHNICAL FIELD

The present invention relates to a method of manufacturing a mask blank and a method of manufacturing a transfer mask.

BACKGROUND ART

In general, fine patterns are formed in semiconductor device manufacturing processes using photolithography. A plurality of photomasks (to be referred to as "transfer masks") is normally used to form these fine patterns. These transfer masks typically have a fine pattern composed of a metal thin film and the like provided on a transparent glass substrate, and photolithography is also used in the manufacturing of these transfer masks.

A mask blank is used in the manufacturing of transfer masks by photolithography. In general, mask blanks are manufactured by forming a thin film on the main surface of a transparent substrate composed of synthetic quartz and the like by a sputtering method. The thin films of these mask blanks tend to be formed on the main surface of a substrate while retaining internal stress.

The main surface of a mask blank is required to have a high flatness. The main surface of the transparent substrate used for the mask blank substrate is also required to have a high flatness. Consequently, the main surface of a mask blank substrate is subjected to processing such as grinding or polishing. However, in the case of having formed a thin film retaining a large amount of internal stress on a transparent substrate having a main surface having a high flatness in this manner, the main surface of the transparent substrate ends up being deformed resulting in the problem of exacerbation of the flatness of the main surface of the transparent substrate.

On the other hand, in the case of a thin film for forming a transfer pattern, a pattern is formed by removing a portion of the thin film (light-transmitting portion) by etching and the like. In the case the thin film retains a large amount of internal stress, when a portion of the thin film (portion serving as the light-transmitting portion) has been removed by etching and the like, the position of the pattern on the transparent substrate ends up moving due to the thin film being released from the internal stress (pattern shifting).

The requirements regarding pattern positional accuracy placed on transfer masks have become even more severe in recent years. The allowed amount of this positional shift has become extremely small in the manufacturing of photo masks applied in double patterning technology in particular.

In double patterning technology, an extremely fine pattern formed on a semiconductor device is divided into two comparatively sparse patterns. Two transfer masks are then fabricated having each of these divided patterns, and patterns are exposed and transferred on the semiconductor device using these two transfer masks. As a result, extremely fine patterns can be formed on a semiconductor device. However, in the case of double patterning technology, if the amount of the positional shift from a design pattern of the patterns formed on the two transfer masks is large, when the patterns are exposed and transferred on the semiconductor device using the two transfer masks, the patterns may end up being formed in a state in which the patterns contain disconnections or short circuits.

In order to solve the aforementioned problem, research has previously been conducted on technologies for reducing the internal stress of mask blank thin films.

For example, Patent Literature 1 describes a method for reducing internal stress of a thin film that comprises forming a thin film on a transparent substrate by a sputtering method followed by carrying out heat treatment on the thin film at a temperature of not less than 150° C. Patent Literature 2 describes a method for irradiating a thin film formed on a transparent substrate with a high energy beam using a flash lamp.

However, as is described in Patent Literature 3, in the case of a method in which a thin film is irradiated with a high energy beam using a flash lamp, the high energy beam ends up having a considerable effect on the glass substrate depending on the exposure level, and this was determined to result in the problem of deformation of the shape of the main surface of synthetic quartz glass substrates.

PRIOR ART LITERATURE

Patent Literature

Patent Literature 1: JP 2002-162726A
Patent Literature 2: JP 2004-199035A
Patent Literature 3: JP 2010-237502A

DISCLOSURE OF THE INVENTION

Problems to be Solved by the Invention

As a result of conducting extensive studies, the inventor of the present invention determined that the following problems are present in the case of carrying out heating treatment as a means for reducing internal stress of the thin film of a mask blank.

The flatness as calculated from a difference in shape has been conventionally used as a method for confirming that the internal stress of a thin film has been reduced by heating treatment. This difference in shape refers to the shape resulting from the difference in shape between the shape of a main surface obtained by measuring the main surface of a transparent substrate with a flatness measuring apparatus prior to forming a thin film, and the shape of a surface obtained by measuring the surface of the thin film with a flatness measuring apparatus after having formed the thin film and further carrying out heating treatment. A small value for this difference in shape is considered to indicate that the internal stress of the thin film has been reduced.

However, when verification was carried out by forming a test pattern on a thin film using a mask blank for which the difference in shape had been adequately reduced by carrying out heating treatment, a comparatively large positional shift of the pattern was determined to occur. This verification was carried out according to the procedure described below.

A resist film was first coated and formed on a thin film of a mask blank. A test pattern was then exposed and drawn on the resist film followed by carrying out developing treatment to form a resist pattern having the test pattern. The position of the resist pattern was then measured using a pattern position measuring apparatus.

Next, the thin film was dry-etched using the resist pattern as a mask to form a test pattern on the thin film. After removing the resist pattern, the position of the test pattern formed on the thin film was measured using a pattern position measuring apparatus.

Finally, the position of the resist pattern and the position of the test pattern formed on the thin film were compared followed by calculation of the amount of positional shift of the test pattern formed on the thin film.

As a result of the aforementioned verification, based on the difference in shape between surface shapes before and after carrying out heating treatment on a mask blank, the amount of positional shift of a test pattern actually formed on a thin film was of a magnitude that was outside the allowable range even though internal stress of the thin film ought to have been adequately reduced.

In this manner, when a pattern was actually formed on a thin film of a mask blank following heating treatment, there was the problem of the occurrence of a phenomenon in which the amount of the positional shift of that pattern from a resist pattern ends up being outside the allowable range.

In addition, this problem was also confirmed to similarly occur even in the case of carrying out treatment comprising radiating a high energy beam from a flash lamp instead of heating treatment as treatment for reducing the internal stress of a thin film. Moreover, a similar phenomenon was confirmed to similarly occur even in the case of carrying out treatment comprising radiating laser light (laser annealing treatment) as treatment for reducing the internal stress of a thin film.

Therefore, an object of the present invention is to provide a method of manufacturing a mask blank and a method of manufacturing a transfer mask that are capable of reducing the internal stress of a thin film.

Means for Solving the Problems

As a result of conducting extensive studies, the inventor of the present invention determined that, even in the case of reducing the difference in shape between the shape of a main surface of a transparent substrate before heating treatment and the shape of the surface of a thin film after heating treatment by carrying out heating treatment on a mask blank, since the shape of the main surface of the transparent substrate ends up being deformed by heating treatment, internal stress of the thin film is not adequately reduced.

More specifically, this phenomenon was confirmed by the method indicated below.

A transparent substrate having a highly flat main surface was first prepared by carrying out grinding and polishing. The shape of the main surface of this transparent substrate was then measured using a flatness measuring apparatus.

Next, a thin film was formed using a sputtering method on the main surface of the transparent substrate on the side on which shape was measured. The shape of the surface of the thin film was then measured using a flatness measuring apparatus.

Continuing, the difference in shape between the shape of the main surface of the transparent substrate measured prior to forming the thin film and shape of the surface of the thin film was determined to calculate the amount of the variation of flatness before and after forming the thin film.

Heating conditions for returning the altered shape of the surface of the thin film of a mask blank to its original shape were selected based on a correlation between heating conditions of the mask blank as determined in a preliminary experiment and the amount of the variation of flatness, and heating treatment was carried out on the transparent substrate on which the thin film had been formed. The shape of the surface of the thin film following heating treatment was then measured using a flatness measuring apparatus.

Next, the entire thin film on the transparent substrate was removed by dry etching. The shape of the main surface of the transparent substrate following removal of the thin film was then measured using a flatness measuring apparatus.

On the basis of these measurement results, the shape of the surface of the thin film following heating treatment was determined to be nearly the same as the shape of the main surface of the transparent substrate prior to forming the thin film. However, the shape of the main surface of the transparent substrate measured after removing the thin film was clearly different from the shape of the main surface of the transparent substrate measured prior to forming the thin film. This means that the shape of the main surface of the transparent substrate changed between the time the flatness was measured prior to forming the thin film and the time the flatness was measured after removing the thin film.

There are several possible factors that have the potential to cause deformation of the shape of a main surface of a transparent substrate. First, one possible effect is the process by which a thin film is formed by depositing sputtered particles on a main surface of a substrate by a sputtering method. In addition, another possible effect is that of dry etching when removing the thin film. However, in the case of measuring using the same procedure as described above while omitting heating treatment only, a difference that exceeded the error range of the measuring apparatus did not result between the shape of the main surface of the transparent substrate measured after removing the thin film and the shape of the main surface of the transparent substrate measured prior to forming the thin film. In other words, the effect of sputtering when forming a thin film on a main surface of the transparent substrate and the effect of dry etching when removing the thin film were unrelated to deformation of the shape of the main surface of the transparent substrate.

Another factor thought to have the potential to cause deformation of the shape of a main surface of a transparent substrate is heating treatment. However, in the case of carrying out heating treatment under the same conditions as previously described on a transparent substrate on which a thin film had not been formed, the resulting difference between the shapes of the main surface of the transparent substrate before and after heating treatment did not exceed the error range of the measurement apparatus.

On the basis of the results of these verifications, the inventor of the present invention determined that, when heating treatment is carried out on a transparent substrate in a state in which a thin film is formed on a main surface of that transparent substrate, the shape of the main surface of the transparent substrate becomes deformed on the side on which the thin film is formed.

In addition, as a result of carrying out verification similar to that described above, the inventor of the present invention determined that, when heating treatment is carried out by irradiating a transparent substrate with a high energy beam using a flash lamp in a state in which a thin film is formed on a main surface of that transparent substrate, the shape of the main surface of the transparent substrate is deformed on the side on which the thin film is formed.

The inventor of the present invention then conducted an additional verification of factors that cause such phenomena.

As a result, it was determined that the shape of a main surface of a transparent substrate is deformed due to hydrogen contained in the transparent substrate.

More specifically, it was determined that the amount of the variation of flatness of a main surface of a transparent substrate can be controlled to not more than 100 nm (preferably not more than 50 nm and more preferably not more than 30 nm) if the hydrogen content of the transparent substrate is less than $7.4 \times 10^{18}$ molecules/cm$^3$ (preferably not more than $1.0 \times 10^{18}$ molecules/cm$^3$, more preferably not more than $6.0 \times 10^{17}$ molecules/cm$^3$, and even more preferably not more than $2.0 \times 10^{17}$ molecules/cm$^3$).

As a result of the aforementioned study, it was concluded that, by applying the following method of manufacturing a mask blank or method of manufacturing a transfer mask, the difference in shape between the shape of a main surface of a transparent substrate prior to thin film formation and the shape of the surface of a thin film following heating treatment or irradiating with light (high energy beam) using a flash lamp can be used as an indicator of internal stress present in a thin film.

(Configuration 1)

A method of manufacturing a mask blank provided with a thin film on a transparent substrate, comprising:

a step of preparing a transparent substrate having a pair of opposing main surfaces that is composed of a glass material having a hydrogen content of less than $7.4 \times 10^{18}$ molecules/cm$^3$, a step of forming a thin film composed of a material containing silicon or metal on one of the main surfaces of the transparent substrate, and a step of carrying out heating treatment or photo irradiation treatment on the transparent substrate on which the thin film has been formed; wherein, the absolute value of an amount of the variation of flatness in a predetermined region, as calculated based on a difference in shape obtained from the shape of one of the main surfaces of the transparent substrate prior to forming the thin film and the shape of one of the main surfaces of the transparent substrate exposed after removing the thin film, is not more than 100 nm.

(Configuration 2)

The method of manufacturing a mask blank described in Configuration 1, wherein a thin film is not formed on the other main surface of the transparent substrate.

(Configuration 3)

The method of manufacturing a mask blank described in Configuration 1 or 2, wherein the step of forming the thin film includes the formation of a thin film on one of the main surfaces of the transparent substrate using a sputtering method.

(Configuration 4)

The method of manufacturing a mask blank described in any of Configurations 1 to 3, wherein the heating temperature of the heating treatment is not less than 300° C.

(Configuration 5)

The method of manufacturing a mask blank described in any of Configurations 1 to 4, wherein the photo irradiation treatment is a treatment for irradiating a transparent substrate on which a thin film is formed with light emitted from a flash lamp.

(Configuration 6)

The method of manufacturing a mask blank described in any of Configurations 1 to 5, wherein the glass material is synthetic quartz glass.

(Configuration 7)

The method of manufacturing a mask blank described in any of Configurations 1 to 6, wherein the thin film is composed of a material containing a transition metal and silicon.

(Configuration 8)

The method of manufacturing a mask blank described in any of Configurations 1 to 7, wherein the thin film has internal stress of not more than 360 MPa.

(Configuration 9)

A method of manufacturing a transfer mask, having a step of forming a transfer pattern on the thin film of a mask blank manufactured with the manufacturing method described in any of Configurations 1 to 8.

Effects of the Invention

According to the present invention, a method of manufacturing a mask blank and a method of manufacturing a transfer mask can be provided that are capable of reducing internal stress of a thin film.

BRIEF DESCRIPTION OF THE DRAWINGS

The FIGURE is a perspective view of a transparent substrate.

BEST MODE FOR CARRYING OUT THE INVENTION

The present invention is a method of manufacturing a mask blank provided with a thin film on a transparent substrate, comprising:

a step of preparing a transparent substrate having a pair of opposing main surfaces that is composed of a glass material having a hydrogen content of less than $7.4 \times 10^{18}$ molecules/cm$^3$, a step of forming a thin film composed of a material containing silicon or metal on one of the main surfaces of the aforementioned transparent substrate, and a step of carrying out heating treatment or photo irradiation treatment on the transparent substrate on which the aforementioned thin film has been formed; wherein, the absolute value of an amount of the variation of flatness in a predetermined region, as calculated based on a difference in shape obtained from the shape of one of the main surfaces of the aforementioned transparent substrate on which the aforementioned thin film is formed and the shape of one of the main surfaces of the aforementioned transparent substrate exposed after removing the aforementioned thin film, is not more than 100 nm.

The method of manufacturing a mask blank of the present invention can be applied to a light-transmitting mask blank for fabricating a light-transmitting mask that allows transmission of exposure light or to a reflective mask blank for fabricating a reflective mask that reflects exposure light. In addition, the method of manufacturing a mask blank of the present invention can be applied to a phase shift mask blank for fabricating a phase shift mask. Moreover, the method of manufacturing a mask blank of the present invention can be preferably applied to a mask blank for fabricating a transfer mask applied in double patterning technology.

The method of manufacturing a mask blank of the present invention has a step of preparing a transparent substrate having a pair of opposing main surfaces that is composed of a glass material having a hydrogen content of less than $7.4 \times 10^{18}$ molecules/cm$^3$, preferably not more than $1.0 \times 10^{18}$ molecules/cm$^3$, more preferably not more than $6.0 \times 10^{17}$ molecules/cm$^3$, and even more preferably not more than $2.0 \times 10^{17}$ molecules/cm$^3$.

On the other hand, there are many cases in which transparent substrates, used in a transfer mask in which short-wavelength pulsed laser light in the form of a KrF excimer laser or ArF excimer laser is applied as exposure light, contain hydrogen. This is because, high-energy light in the form of an ArF excimer laser in particular causes damage to internal structure when it passes through the inside of a transparent substrate, and hydrogen fulfills the role of repairing that damage. In the case of considering this point, the transparent substrate in the method of manufacturing a mask blank of the present invention is preferably formed with a glass material having a hydrogen content of not less than $1.0 \times 10^{17}$ molecules/cm$^3$.

Examples of glass materials that can be used for the material of the transparent substrate include synthetic quartz glass, soda lime glass, aluminosilicate glass, low thermal expansion glass (such as $SiO_2$—$TiO_2$-based glass) and crystallized glass precipitated from a β-quartz solid solution.

The hydrogen content in the material of the transparent substrate can be measured by laser Raman scattering spectroscopy. For example, hydrogen content can be measured according to a photon counting method using the HQS-1000 manufactured by JASCO Corp.

The method of manufacturing a mask blank of the present invention has a step of forming a thin film composed of a material containing silicon or metal and having film stress (internal stress) on one of the main surfaces of a transparent substrate. Furthermore, "main surfaces" as referred to here refers to a pair of main surfaces 71 excluding lateral surfaces 72 and chamfered surfaces 73 as shown in the FIGURE, for example. Furthermore, this thin film includes a configuration in which it is only formed on one of the main surfaces, a configuration in which it is continuously formed on one of the main surfaces and on chamfered surfaces adjacent to that main surface, and a configuration in which it is continuously formed to a portion of the lateral surfaces adjacent to those chamfered surfaces.

Examples of the thin film formed on one of the main surfaces of the transparent substrate include a light shielding film, multilayer reflective film, phase shift film (halftone phase shift film) and semi-transparent film.

Although a known method can be used to form the thin film on one of the main surfaces of the transparent substrate, a sputtering method is used preferably and a reactive sputtering method is used particularly preferably. The use of a sputtering method makes it possible to give the thin film formed an amorphous structure or microcrystalline structure. In addition, thin films formed by sputtering tend to have high film stress, thereby enabling the method of manufacturing a mask blank of the present invention to be used preferably.

Examples of the material of the thin film in the form of a "material containing silicon or metal" include materials containing silicon, materials comprised of a metal other than silicon, materials comprised of silicon and a metal other than silicon, and materials comprised of one or more types of any of oxygen, nitrogen and carbon in addition thereto. Examples of metals other than silicon include transition metals such as W, Mo, Ti, Ta, Zr, Hf, Nb, V, Co, Cr or Ni. Examples of such materials include molybdenum silicide oxide (MoSiO), molybdenum silicide nitride (MoSiN), molybdenum silicide carbide (MoSiC), molybdenum silicide oxide nitride (MoSiON), molybdenum silicide oxide carbide (MoSiOC) and molybdenum silicide oxide nitride carbide (MoSiONC). However, heating treatment or photo irradiation treatment on the thin film is carried out under conditions such that a phenomenon occurs that results in elimination of hydrogen from the transparent substrate. Thus, materials that end up undergoing extensive degradation by heating treatment or photo irradiation treatment under such conditions are not preferable as materials of the thin film of the present invention. Examples of such materials include chromium metal, chromium oxide (CrO), chromium nitride (CrN), chromium carbide (CrC), chromium oxide nitride (CrON), chromium oxide carbide (CrOC), chromium carbide nitride (CrCN) and chromium oxide nitride carbide (CrOCN).

The method of producing a mask blank of the present invention has a step of carrying out "heating treatment" or "photo irradiation treatment" for reducing film stress on a transparent substrate on which a thin film has been formed. Furthermore, "film stress" referred to here refers to internal stress of a thin film. There are cases in which internal stress of a thin film is compressive stress and cases in which it is tensile stress.

First, an explanation is provided of heating treatment for reducing film stress.

Internal stress of the thin film can be reduced by carrying out heating treatment on the transparent substrate on which the thin film is formed. Although examples of means for carrying out heating treatment that can be used include an electric heating furnace, heater, halogen lamp and infrared lamp, among these, an electric heating furnace is used preferably.

Heating treatment is preferably carried out in a state in which a gas from which hydrogen has been removed as much as possible is present around the transparent substrate. Although the amount of hydrogen present in air is low, a large amount of water vapor is present. Although the humidity of air in a clean room is controlled, the air in a clean room is comprised of a comparatively large amount of water vapor. Carrying out heating treatment on the transparent substrate in dry air makes it possible to inhibit the penetration of hydrogen derived from water vapor into the transparent substrate. Moreover, the transparent substrate is more preferably subjected to heating treatment in a gas not comprised of hydrogen or water vapor (such as an inert gas or rare gas such as nitrogen). In addition, heating treatment of the transparent substrate can also be carried out in a vacuum.

The heating temperature of the transparent substrate during heating treatment is not less than 300° C., preferably not less than 400° C. and more preferably not less than 450° C. Heating the transparent substrate having a thin film formed on a main surface thereof within these temperature ranges makes it possible to adequately reduce internal stress of the thin film.

Next, an explanation is provided of photo irradiation treatment for reducing film stress.

In photo irradiation treatment, treatment is carried out by irradiating a transparent substrate having a thin film formed thereon with light (high energy beam) emitted from a flash lamp. Alternatively, in photo irradiation treatment, treatment is carried out by irradiating a transparent substrate having a thin film formed thereon with laser light.

In the case of photo irradiation treatment comprising radiation of light emitted from a flash lamp, the flash lamp is a light source capable of emitting light having a continuous, broad wavelength range. A lamp having a gas such as xenon sealed in a tube made of a material such as glass that allows transmission of light, and is capable of emitting light by application of high voltage in pulses, for example, can be used for the flash lamp.

Although varying according to the type and composition of the thin film, irradiation intensity of the flash lamp is 0.1 $J/cm^2$ to 100 $J/cm^2$, preferably 1 $J/cm^2$ to 50 $J/cm^2$, and more preferably 10 $J/cm^2$ to 50 $J/cm^2$. If irradiation intensity exceeds these ranges, there is the risk of the film being scattered or the occurrence of surface roughening. If irradiation intensity is below these ranges, there is a risk of the effect of reducing film stress being diminished.

The irradiation time of light emitted by the flash lamp is not more than 1 second, preferably not more than 0.1 seconds and more preferably not more than 0.01 seconds. Shortening the irradiation time of light emitted by the flash lamp makes it possible to reduce film stress without excessive heating of the transparent substrate. As a result, damage to the transparent substrate can be prevented.

In the present invention, in the case of irradiating a thin film formed on a main surface of a transparent substrate with light emitted from a flash lamp, light may be radiated so that irradiation is completed in a single round of irradiation or irradiation may be divided into a plurality of rounds of irradiation. In addition, in the case the film has a multilayer structure, the film may be irradiated each time a film is deposited or may be collectively irradiated after a plurality of films have been deposited. In addition, light from the flash lamp may be radiated from the side of the film or may be radiated from the side of the substrate surface when light is passed through the substrate. In addition, the atmosphere surrounding the location where the transparent substrate is placed when irradiated with light from the flash lamp may be any atmosphere containing an inert gas such as argon, nitrogen, oxygen or a mixed gas of two or more types thereof in a vacuum or in air.

On the other hand, in the case of photo irradiation treatment comprising radiating laser light, stress of the thin film can be reduced by irradiating the surface of the thin film of a transparent substrate having a thin film formed thereon with laser light and heating the thin film to a high temperature (such as not less than 1000° C.) for an extremely short period of time (such as several tens of nanoseconds). Although the wavelength of the laser light radiated onto the thin film cannot be summarily defined since it varies according to the material of the thin film, it is preferably within a range of 157 nm to 633 nm and more preferably within a range of 248 nm to 308 nm. In addition, although the intensity of the laser light can also not be summarily defined since it varies according to the material of the thin film, energy density is preferably within the range of 100 $mJ/cm^2$ to 500 $mJ/cm^2$ and more preferably within the range of 200 $mJ/cm^2$ to 400 $mJ/cm^2$. A XeCl excimer laser (wavelength: 308 nm), for example, is preferably applied for the laser light.

In the present invention, in the case of irradiating a thin film formed on a main surface of a transparent substrate with laser light, the laser light is preferably radiated so as to scan the surface of the thin film. The surface of the thin film may be scanned with laser light after having formed the laser light emitted from a laser oscillator into a line beam with line beam optics. Irradiation of the thin film with laser light may be carried out once or a plurality of times. In addition, in the case of a film having a multilayer structure, laser light may be radiated each time a film is deposited or laser light may be radiated collectively after having deposited a plurality of films. In addition, laser light may be radiated from the side of the film or may be radiated from the side of the substrate surface when light is passed through the substrate. In addition, the atmosphere surrounding the location where the transparent substrate is placed when irradiated with laser light may be any atmosphere containing an inert gas such as argon, nitrogen, oxygen or a mixed gas of two or more types thereof in a vacuum or in air.

Photo irradiation treatment by radiating light emitted from a flash lamp and photo irradiation treatment by radiating laser light are preferably carried out in a state in which a gas from which hydrogen has been removed as much as possible is present around the transparent substrate. Although the amount of hydrogen per se present in air is low, a large amount of water vapor is present. Although the humidity of air in a clean room is controlled, the air in a clean room is comprised of a comparatively large amount of water vapor. Carrying out photo irradiation on the transparent substrate in dry air makes it possible to inhibit the penetration of hydrogen derived from water vapor into the transparent substrate. Moreover, the transparent substrate is more preferably irradiated with light in a gas that is not comprised of hydrogen or water vapor (such as an inert gas or rare gas, for example, nitrogen). Photo irradiation can also be carried out in air at atmospheric pressure or in a vacuum.

The method of manufacturing a mask blank of the present invention is characterized in that, the absolute value of an amount of the variation of flatness in a predetermined region, as calculated based on a difference in shape obtained from the shape of one of the main surfaces of a transparent substrate prior to forming a thin film and the shape of one of the main surfaces of the transparent substrate exposed after removing the thin film, is not more than 100 nm. This absolute value of the amount of the variation of flatness is preferably not more than 80 nm, more preferably not more than 50 nm and even more preferably not more than 30 nm.

Measurement of the shape of one of the main surfaces of the transparent substrate prior to forming a film can be carried out using a surface shape analyzer (profilometer). Measurement of the shape of one of the main surfaces of the transparent substrate exposed after removing the thin film can also be carried out using a surface shape analyzer (profilometer). In addition, calculation of the difference in shape between the main surfaces of the transparent substrate before forming the thin film and after removing the thin film, and calculation of the amount of the variation of flatness based on the difference in shape, can also be carried out using a surface shape analyzer. The UltraFLAT 200M (Corning Tropel Corp.), for example, can be used for the surface shape analyzer. Furthermore, calculation of the amount of the variation of flatness based on the difference in shape can be carried out using a known method, and can be carried out using the method disclosed in JP 2010-237502A, for example.

The predetermined region where the amount of the variation of flatness is calculated based on the difference in shape is required to at least comprise the region of the thin film where a transfer pattern is formed. The predetermined region is preferably a region inside a square measuring 132 mm on a side based on the center of the main surface of the transparent substrate (hereinafter to be referred to as a "region inside a 132 mm square"), and is more preferably a region inside a square measuring 142 mm on a side (hereinafter to be referred to as a "region inside a 142 mm square"). In addition, the region in which the difference in shape is calculated is required to be a region that comprises the predetermined region. Moreover, the region where the shape of the main surface and shape of the surface of the thin film are measured with a profilometer is also required to be a region comprising the predetermined region.

One of the main surfaces of the transparent substrate prior to forming a thin film preferably has a high flatness. The flatness of one of the main surfaces calculated in the region inside a 132 mm square is preferably not more than 0.3 μm, more preferably not more than 0.2 μm and even more preferably not more than 0.1 μm. In addition, the flatness of one of the main surfaces calculated in the region inside a 142 mm square is preferably not more than 0.3 μm, more preferably not more than 0.2 μm and even more preferably not more than 0.1 μm. Furthermore, the other main surface opposing the one of the main surfaces also preferably has an equal or greater flatness.

Removal of the thin film can be carried out by a method similar to dry etching used when forming a pattern on a thin film. For example, in the case the thin film is composed of a material comprising silicon (Si) and a transition metal (such as Mo), the thin film can be removed by dry etching using an etching gas comprising a fluorine-based gas. In addition, the thin film can also be removed by dry etching using an etching gas that comprises a chlorine-based gas but does not contain oxygen, or by dry etching using an etching gas that comprises a chlorine-based gas and oxygen gas, depending on the composition of the materials that compose the thin film. In addition, wet etching may also be applied to remove the thin film depending on the composition of the materials that compose the thin film.

According to the method of manufacturing a mask blank of the present invention, the absolute value of an amount of the variation of flatness in a predetermined region, as calculated based on a difference in shape obtained from the shape of one of the main surfaces of the transparent substrate prior to forming the thin film (state in which nothing is provided on one of the main surfaces) and the shape of one of the main surfaces of the transparent substrate exposed after removing the thin film, is not more than 100 nm. According to the method of manufacturing a mask blank of the present invention, the amount of change in the shape of a main surface, on the side of a transparent substrate on which a thin film is formed, before and after heating treatment or photo irradiation treatment can be significantly inhibited. Consequently, the difference in shape between the shape of a main surface of a transparent substrate before forming a thin film and the shape of the surface of the thin film after heating treatment or photo irradiation treatment can be used as a more accurate indicator of internal stress present in a thin film.

In the method of manufacturing a mask blank of the present invention, a method comprising obtaining a difference in shape by subtracting the shape of one of the main surfaces of a transparent substrate exposed after removing a thin film from the shape of one of the main surfaces of the aforementioned transparent substrate prior to forming the thin film, or a method comprising obtaining a difference in shape by subtracting the shape of one of the main surfaces of a transparent substrate prior to forming a thin film from the shape of one of the main surfaces of the aforementioned transparent substrate exposed after removing the thin film can be applied for the method used to calculate a difference in shape.

As has been previously described, in the case of using the prior art, the shape per se of one of the main surfaces of a transparent substrate on which a thin film is formed ends up changing considerably due to heating treatment or photo irradiation treatment. Consequently, even if conditions of heating treatment or photo irradiation treatment are adjusted by using a difference in shape between the shape of the surface of a thin film after carrying out heating treatment or photo irradiation treatment on a transparent substrate and the shape of one of the main surfaces of the transparent substrate as an indicator, internal stress of the thin film was unable to be adequately reduced.

In contrast, according to the method of manufacturing a mask blank of the present invention, changes in the shape of one of the main surfaces of a substrate before and after heating treatment or photo irradiation treatment can be significantly inhibited. Consequently, even if treatment conditions of heating treatment or photo irradiation treatment are adjusted by using a difference in shape between the shape of the surface of a thin film after carrying out heating treatment or photo irradiation treatment and the shape of one of the main surfaces of a transparent substrate as an indicator, internal stress of a thin film formed on one of the main surfaces of the transparent substrate after heating treatment or photo irradiation treatment can be reduced to not more than 360 MPa, preferably not more than 300 MPa and more preferably not more than 180 MPa.

A glass material containing a certain degree of hydrogen is typically used as the materials of transparent substrates used in transfer masks, in which short-wavelength, pulsed laser light in the form of a KrF excimer laser or ArF excimer laser is applied for the exposure light. This is because high-energy ArF excimer laser light in particular causes damage to internal structure when it passes through the glass material, and hydrogen fulfills the role of repairing that damage. On the other hand, the containing of hydrogen in the glass materials of transparent substrates had not been previously found to cause any particular demerits.

The inventor of the present invention suspected that hydrogen present in the glass material used to form a transparent substrate has an effect on changes in the shape of the main surfaces of transparent substrates before and after heating treatment or photo irradiation treatment. In order to confirm that possibility, a plurality of transparent substrates having different hydrogen contents was prepared and those substrates were verified in the manner described below. First, the shape of the main surfaces of each transparent substrate was measured with a flatness measuring apparatus prior to forming a thin film. Next, a thin film was formed under the same conditions on only one of the main surfaces of each of the prepared transparent substrates. Continuing, heating treatment was carried out under the same conditions on each of the transparent substrates following film formation. Next, the thin film of each transparent substrate was completely removed by dry etching following heating treatment. Next, the shape of the main surface was measured with a flatness measuring apparatus following removal of the thin film. Moreover, the difference in shape between the shape of the main surface prior to forming the thin film and the shape of the main surface after removing the thin film was calculated. The correlation between hydrogen content and the amount of the variation of flatness of the main surface within a predetermined range as calculated from the difference in shape was then examined.

As a result, it was determined that the amount of the variation of flatness of the main surface increased as the hydrogen content of the glass material forming the transparent substrate increased. Moreover, it was also determined that the amount of the variation of flatness of the main surface is able to be inhibited to not more than 100 nm by making the hydrogen content of the glass material forming the transparent substrate to be at least less than $7.4 \times 10^{18}$ molecules/cm$^3$. In addition, during the course of the aforementioned verification, in the case of verifying by applying a mask blank having a thin film formed under the same conditions on the other main surface (mask blank in which thin films are formed on both main surfaces), the amount of the variation of flatness within a predetermined range as calculated from a difference in shape was within the range of measurement error of the flatness measurement apparatus in all cases regardless of the hydrogen content of the transparent substrate.

On the basis of these verification results, the cause of hydrogen content of the transparent substrates having an effect on a change in shape of the main surface is presumed to be as indicated below. Furthermore, the following discussion is based on a supposition of the inventors of the present invention at the time of filing, and is not intended to limit the claims of the present invention in any way.

When a transparent substrate composed of a glass material containing hydrogen is subjected to heating treatment, hydrogen is eliminated from the surface (and particularly from the two main surfaces having a large surface area). Elements such as Si bound to hydrogen prior to its elimination attempt to bond with different elements. At this time, stress (tensile stress) is generated that acts on internal structure in a direction that causes it to shrink due to shrinkage of gaps in the internal space formed due to elimination of hydrogen. In the case of a transparent substrate in a state in which a thin film is not provided at all on the surface thereof (state in which the entire surface is exposed to the atmosphere), hydrogen content is lower in the surface layer near the surface in comparison with that inside the substrate, and tensile stress is easily generated in the surface layer. In this case, however, the hydrogen content decreases to about the same degree in both surface layers near the two main surfaces, the amount of tensile stress generated in the surface layers is about the same and is in balance, and it is unlikely that a prominent change in shape occurs in either of the main surfaces.

On the other hand, in the case of carrying out heating treatment on a transparent substrate composed of a glass material containing hydrogen in a state in which a thin film is formed on only one of the main surfaces, the elimination of hydrogen into the atmosphere is inhibited by the thin film on the side of the main surface on which the thin film has been formed. Consequently, the hydrogen content of the surface layer on the side of the main surface on which the thin film has been formed tends to be higher than the hydrogen content of the surface layer on the side of the other main surface where a thin film is not formed (main surface in a state in which the surface thereof is exposed to the atmosphere). At the same time, tensile stress of the surface layer on the side of the main surface on which the thin film has been formed tends to be lower than tensile stress of the surface layer on the side of the main surface where a thin film is not formed. As a result, the main surface on the side on which the thin film has been formed tends to be deformed into a concave shape, while the main surface on the side where a thin film is not formed tends to be deformed into a convex shape.

The amount of hydrogen eliminated during heating treatment also increases the greater the hydrogen content present in the glass material that composes the transparent substrate. As a result, tensile stress generated in the surface layers on the sides of the main surfaces of the transparent substrate also increases. A difference between tensile stress on the side of one main surface on which a thin film has been formed and tensile stress generated in the other main surface where a thin film is not formed also increases as the hydrogen content of the glass material increases. Conversely, the difference between tensile stress on the side of one of the main surfaces on which a thin film has been formed and tensile stress generated in the other main surface where a thin film is not formed decreases considerably by making the hydrogen content of the glass material composing the transparent substrate to be less than $7.4 \times 10^{18}$ molecules/cm$^3$, thereby making it possible to inhibit the absolute value of the amount of the variation of flatness of the main surface to not more than 100 nm.

Furthermore, the aforementioned verifications and discussion were described for the case of carrying out heating treatment or photo irradiation treatment in a state in which the other main surface of the transparent substrate is exposed. However, in the case a thin film has also been formed on the other main surface, considerable changes in shape may also occur in one main surface unless the hydrogen content of the glass material that composes the transparent substrate is made to be less than $7.4 \times 10^{18}$ molecules/cm$^3$. Examples of such cases include the case in which a thin film formed on the other main surface has properties that significantly facilitate permeation of hydrogen in comparison with a thin film formed on one main surface (such as due to differences in materials used to form the thin film, considerable differences in film thickness or considerable differences in thin film layer structure).

On the other hand, verification was also carried out for the case of applying photo irradiation treatment comprising radiating light emitted from a flash lamp in the same manner as in the case of heating treatment. The change in shape per se of one of the main surfaces of a transparent substrate before and after photo irradiation treatment, and being able to significantly reduce changes in shape of that main surface by making the hydrogen content of the transparent substrate to be less than $7.4 \times 10^{18}$ molecules/cm$^3$, were the same as in the case of heating treatment. However, in the case of photo irradiation treatment, a tendency for the shape of the one of the main surfaces of the transparent substrate to change to a concave shape differed considerably from the case of heating treatment. The cause of this is presumed to be as indicated below. Furthermore, the following discussion is based on a supposition of the inventors of the present invention at the time of filing, and is not intended to limit the claims of the present invention in any way.

The amount of time during which photo irradiation treatment comprising radiating light emitted from a flash lamp is carried out is considerably shorter in comparison with the amount of time during which heating treatment is carried out (with heating treatment being carried out for several tens of minutes to several hours in contrast to photo irradiation treatment being carried out in second units). When photo irradiation treatment is carried out on a transparent substrate on which a thin film has been formed, the region that is heated to a temperature at which hydrogen is eliminated extends to the thin film and surface layer on the side of one of the main surfaces on the side where that thin film is formed. The other main surface that is not irradiated with light from the flash lamp is not heated to a temperature at which hydrogen is eliminated. Hydrogen is eliminated from the surface layer on the side of one of the main surfaces of the transparent substrate on which the thin film has been formed, and although considerable tensile stress tends to be generated as a result thereof, there is substantially no change in internal stress in the other main surface from which hydrogen is not eliminated. As a result, the main surface on the side on which the thin film has been formed tends to be deformed to a concave shape due to the effect of that tensile stress, and accompanying that the other main surface on the side where a thin film is not formed tends to change to a convex shape.

In addition, when verification was carried out in the case of applying photo irradiation treatment comprising radiation of laser light, a tendency was obtained that was similar to the case of photo irradiation treatment comprising radiating light emitted from a flash lamp. Similar to photo irradiation treatment comprising radiating light emitted from a flash lamp, in the case of photo irradiation treatment comprising radiating of laser light, this is presumed to be caused by the fact that the region heated to a temperature at which hydrogen is eliminated extends to the thin film and the surface layer of the main surface on the side where the thin film is formed on the transparent substrate.

In the method of manufacturing a mask blank of the present invention, a transparent substrate is used in which the hydrogen content is less than $7.4 \times 10^{18}$ molecules/cm$^3$, preferably not more than $1.0 \times 10^{18}$ molecules/cm$^3$, more preferably not more than $6.0 \times 10^{17}$ molecules/cm$^3$, and even more preferably not more than $2.0 \times 10^{17}$ molecules/cm$^3$. As a result, even in the case of carrying out heat treatment on a transparent substrate in which a thin film is formed on one of the main surfaces thereof, there is a little elimination of hydrogen from the transparent substrate and deformation of the shape of the one the main surfaces of the transparent substrate to a convex shape can be inhibited. In addition, in the case of radiating light emitted from a flash lamp or radiating laser light onto the thin film formed on one of the main surfaces of the transparent substrate as well, since there is hardly any elimination of hydrogen from the transparent substrate, deformation of the shape of one of the main surfaces of the transparent substrate to a concave shape can also be inhibited.

According to the method of manufacturing a mask blank of the present invention, deformation of the shape of a main surface of a substrate to a convex shape or concave shape attributable to heating treatment or photo irradiation treatment can be inhibited. As a result, a difference in shape between the shape of a main surface of a transparent substrate prior to thin film formation and the shape of the surface of the thin film following heating treatment or photo irradiation treatment can be used as an indicator of internal stress present in the thin film. Namely, by controlling a difference in shape between the shape of a main surface of a transparent substrate prior to thin film formation and the shape of the surface of a thin film following heating treatment or photo irradiation treatment to within a predetermined value, internal stress of the thin film can be reduced to not more than 360 MPa (and preferably not more than 300 MPa and even more preferably not more than 180 MPa).

The method of manufacturing a mask blank of the present invention can be applied to the mask blanks indicated in (1) to (3) below.

(1) Binary Mask Blank Provided with a Light Shielding Film Composed of Material Comprising a Transition Metal This binary mask blank is of a form that has a light shielding film (thin film) on a transparent substrate. This light shielding film is composed of a material comprised of a transition metal alone, such as chromium, tantalum, ruthenium, tungsten, titanium, hafnium, molybdenum, nickel, vanadium, zirconium, niobium, palladium or rhodium, or a compound thereof. Examples thereof include light shielding films composed of a tantalum compound obtained by adding one or more types of elements selected from among elements such as oxygen, nitrogen or boron to tantalum.

In these binary mask blanks, the light shielding film may have a two-layer structure comprising a light shielding layer and a surface antireflection layer, or a three-layer structure obtained by adding a backside antireflection layer between the light shielding layer and the substrate.

In addition, the light shielding film may be a compositional gradient film in which the composition in the direction of thickness thereof varies either continuously or in steps.

(2) Phase Shift Mask Blank Provided with a Semi-Transparent Film Composed of a Material Comprising a Compound of a Transition Metal and Silicon (Including Transition Metal Silicides, and Particularly Molybdenum Silicides)

An example of a phase shift mask blank is that of a form having a semi-transparent film (thin film) on a transparent substrate, and an example thereof is a halftone phase shift mask of a type that is provided with a shifter portion by patterning the semi-transparent film. An example of this phase shift mask is that of a form having a semi-transparent film and a light shielding film (light shielding band) thereon on a transparent substrate in order to prevent pattern defects in a transferred substrate caused by patterning the semi-transparent film formed in a transfer region based on light that has passed through the semi-transparent film. In addition, other examples of phase shift mask blanks in addition to halftone phase shift mask blanks include a mask blank for a Levenson phase shift mask of the substrate engraved type, in which a shifter portion is provided by etching a transparent substrate, and a mask blank for an enhancer phase shift mask.

The semi-transparent film of the aforementioned halftone phase shift mask blank allows transmission of light of an intensity that substantially does not contribute to exposure (having, for example, intensity of 1% to 30% relative to exposure light wavelength), and has a predetermined phase difference (such as 180 degrees). Due to the presence of a semi-transparent portion where this semi-transparent film is patterned, and a transparent portion where the semi-transparent film is not formed that transmits light of an intensity that substantially contributes to exposure light, a relationship results in which the phase of the light that has passed through the semi-transparent portion is substantially inverted relative to the phase of the light that has passed through the transparent portion. As a result, light that passes near the boundary between the semi-transparent portion and the transparent portion is mutually canceled out as a result of entering the other region due to diffraction phenomena, thereby resulting in light intensity at the boundary becoming nearly zero and improved contrast, or resolution, in the boundary region.

This semi-transparent film is composed of a material comprised of, for example, a transition metal and silicon (including transition metal silicides). Examples of such materials include materials having a transition metal, silicon and oxygen and/or nitrogen as primary constituents thereof. Examples of applicable transition metals include molybdenum, tantalum, tungsten, titanium, hafnium, nickel, vanadium, zirconium, niobium, palladium, ruthenium, rhodium and chromium.

In addition, in the case of a mask blank of a form having a light shielding film on a semi-transparent film, the material of the aforementioned semi-transparent film is comprised of transition metal and silicon. Consequently, the material of the light shielding film is preferably a material that has etch selectivity (etching resistance) with respect to the semi-transparent film, and is particularly preferably chromium or a chromium compound obtained by adding an element such as oxygen, nitrogen or carbon to chromium.

A Levenson phase shift mask is fabricated from a mask blank having the same composition as a binary mask blank. Consequently, the composition of a thin film for pattern forming is the same as that of the light shielding film of a binary mask blank. Although the semi-transparent film of a mask blank for an enhancer phase shift mask allows transmission of light of an intensity that does not substantially contribute to exposure (having, for example, intensity of 1% to 30% relative to exposure light wavelength), the phase difference generated in transmitted exposure light is small (such as a phase difference of not more than 30 degrees and preferably 0 degrees). With respect to this point, the semi-transparent film of a mask blank for an enhancer phase shift mask differs from the semi-transparent film of a halftone phase shift mask blank. Although the material of this semi-transparent film comprises the same elements as those of the semi-transparent film of a halftone phase shift mask blank, the compositional ratio of each element and film thickness are adjusted so as to yield a predetermined transmittance and predetermined small phase difference with respect to exposure light.

(3) Binary Mask Blank Provided with Light Shielding Film Composed of Material Comprising a Compound of a Transition Metal and Silicon (Including Transition Metal Silicides, and Particularly Molybdenum Silicides)

This light shielding film (thin film) is composed of a material comprising a compound of transition metal and silicon. Examples of such materials include materials having a transition metal, silicon and oxygen and/or nitrogen as primary constituents thereof. In addition, examples of the material of the light shielding film include materials having a transition metal and oxygen, nitrogen and/or boron as primary constituents thereof. Examples of applicable transition metals include molybdenum, tantalum, tungsten, titanium, hafnium, nickel, vanadium, zirconium, niobium, palladium, ruthenium, rhodium and chromium.

In the case of forming the light shielding film with a molybdenum silicide compound in particular, the light shielding film may have a two-layer structure comprising a light shielding layer (such as MoSi) and a surface antireflection layer (such as MoSiON), or a three-layer structure obtained by adding a backside antireflection layer (such as MoSiON) between the light shielding layer and the substrate.

In addition, the light shielding film may be a compositional gradient film in which the composition in the direction of thickness thereof varies either continuously or in steps.

In addition, the thickness of a resist film may be reduced by forming an etching mask film on the light shielding film in order to form a fine pattern. This etching mask film is preferably composed of a material having etch selectivity (having etching resistance) with respect to etching of a light shielding film comprising a transition metal silicide. The etching mask film is particularly preferably composed of a material composed of chromium or a chromium compound obtained by adding an element such as oxygen, nitrogen or carbon to chromium. At this time, a transfer mask may be fabricated with the etching mask film remaining on the light shielding film by giving the etching mask film an antireflection function.

A transfer mask can be fabricated by forming a transfer pattern on a thin film of a mask blank manufactured according to the method of manufacturing a mask blank of the present invention. Formation of the transfer pattern on the thin film can be carried out using a known method.

EXAMPLES

The following provides a more detailed explanation of embodiments of the present invention through examples thereof. An explanation is also provided of comparative examples with respect to the examples.

Example 1

A transparent substrate composed of synthetic quartz glass having a thickness of about 6.35 mm was first prepared having main surface dimensions of about 152 mm×about 152 mm. The main surfaces of this transparent substrate were polished to a predetermined flatness and surface roughness followed by subjecting to predetermined cleaning treatment and drying treatment. Furthermore, the flatness in the region inside a 142 mm square on the main surface on the side of this transparent substrate where a thin film is formed (one of the main surfaces) was not more than 0.3 µm and the surface had a convex shape. In addition, the surface roughness of the main surfaces was such that the root mean square roughness (Rq) of a measured region within a square measuring 1 µm on a side was not more than 0.2 nm. When the concentration of hydrogen in the material of this transparent substrate was measured by laser Raman scattering spectroscopy, it was found to be $2.0 \times 10^{17}$ [molecules/cm$^3$]. The shape of one of the main surfaces of this transparent substrate was measured using a surface shape analyzer (UltraFLAT 200M, (Corning Tropel Corp.)). (The measured region was a region within a square measuring 142 mm on a side based on the center of the transparent substrate. This is to apply similarly to all subsequent measured regions used to measure the shape of surfaces with a surface shape analyzer.)

Next, a halftone phase shift film (thin film) for an ArF excimer laser (wavelength: 193 nm) was formed on the transparent substrate composed of synthetic quartz glass. More specifically, a MoSiN film was deposited at a film thickness of 67 nm on the transparent substrate composed of synthetic quartz glass by reactive sputtering (DC sputtering) using a single-wafer sputtering system. A mixed target of molybdenum (Mo) and silicon (Si) (at % ratio: Mo:Si=6:94) was used for the sputtering target. A mixed gas of argon, nitrogen and helium (gas pressure: 0.3 Pa, gas flow ratio: Ar:N$_2$:He=12.5:50:100) was used for the sputtering gas. The electrical power of the DC power supply was 3.0 kW. This halftone phase shift film had optical characteristics comprising transmittance of 6.1% and phase difference of 177.1 degrees at the wavelength of the ArF excimer laser. The surface shape of the halftone phase shift film (thin film) formed on the main surfaces of the transparent substrate was measured using the same surface shape analyzer as previously described.

Next, heating treatment (annealing treatment) was carried out for 30 minutes at 450° C. on this transparent substrate provided with a thin film and treatment was carried out to reduce film stress of the thin film. The surface shape of the thin film following heating treatment was then measured using the same surface shape analyzer as previously described.

Next, the thin film formed on one of the main surfaces of the transparent substrate was completely removed by dry etching using a mixed gas of SF$_6$ and He for the etching gas. The shape of one of the main surfaces of the transparent substrate following removal of the thin film was then measured using the same surface shape analyzer as previously described.

A transparent substrate having a concentration of hydrogen in the material thereof of $2.0 \times 10^{17}$ [molecules/cm$^3$] was prepared using the same process as this Example 1. The shape of one of the main surfaces of this transparent substrate was measured using a surface shape analyzer. Next, a halftone phase shift film (thin film) composed of a MoSiN film was formed on one of the main surfaces of this transparent substrate by reactive sputtering under the same conditions. Heat treatment was carried out under the same conditions on this transparent substrate after having formed the thin film. The shape of the surface of the thin film formed following heating treatment was similarly measured with a surface shape analyzer. The amount of the variation of flatness as calculated from the difference in shape obtained by subtracting the shape of one of the main surfaces of the transparent substrate prior to thin film formation from the shape of the surface of the thin film following heat treatment was −0.024 [μm].

Next, a light shielding film composed of a chromium-based material was formed on this halftone phase shift film (thin film). As a result, a mask blank was fabricated in which a halftone phase shift film and light shielding film were laminated on a transparent substrate. The light shielding film had a structure in which a CrOCN layer, CrN layer and CrOCN layer were laminated starting from the side of the transparent substrate, and the total thickness of the three layers was 48 nm. Continuing, a resist film was formed on the light shielding film by spin coating. Next, a test pattern was drawn and exposed on the resist film followed by developing treatment and the like to form a resist pattern. The test pattern was measured for the resist pattern having the test pattern formed thereon using a pattern position measuring apparatus (LMS IPRO Series, KLA-Tencor Corp.). Etching was then carried out using this resist pattern as a mask to form a test pattern on the light shielding film.

Continuing, the resist film was removed and dry etching was carried out using the light shielding film having the test pattern formed thereon as a mask to form a test pattern on the halftone phase shift film. According to these steps, a transfer mask for pattern testing was fabricated on a transparent substrate that had a layer structure comprising a halftone phase shift film and a light shielding film having a test pattern formed thereon. The test pattern was measured for the halftone phase shift film and light shielding film having a test pattern formed thereon using a pattern position measuring apparatus.

The test pattern formed on the resist film and the test pattern formed on the halftone phase shift film and light shielding film were compared using a pattern position measuring apparatus. When the amount of positional shift of the test pattern formed on the halftone phase shift film was determined, it was found to be a maximum of 1.2 nm. This amount of positional shift was of a magnitude that was sufficiently within the allowable range of a transfer mask applying double patterning technology.

Example 2

In Example 2, treatment comprising irradiating light emitted from a flash lamp onto a transparent substrate having a thin film formed thereon (photo irradiation treatment) was carried out instead of heating treatment comprising heating a transparent substrate having a thin film formed thereon as treatment for reducing film stress of a thin film. In this photo irradiation treatment, treatment was carried out by radiating light for 0.01 seconds at an irradiation intensity of 15 J/cm$^2$ using a xenon flash lamp. With the exception of carrying out photo irradiation treatment instead of heating treatment, the shape of the main surfaces of the transparent substrate and the shape of the surface of the thin film were measured under the same conditions and according to the same procedure as the aforementioned Example 1.

Comparative Example 1

In Comparative Example 1, the shape of the main surfaces of a transparent substrate and the shape of the surface of a thin film were measured under the same conditions and according to the same procedure as the aforementioned Example 1 with the exception of using a transparent substrate in which the concentration of hydrogen in the material thereof was $7.4 \times 10^{18}$ [molecules/cm$^3$].

Comparative Example 2

In Comparative Example 2, the shape of the main surfaces of a transparent substrate and the shape of the surface of a thin film were measured under the same conditions and according to the same procedure as the aforementioned Example 2 with the exception of using a transparent substrate in which the concentration of hydrogen in the material thereof was $7.4 \times 10^{18}$ [molecules/cm$^3$].

The amounts of the variation of flatness [μm] as described in (1) to (5) below were calculated for each of Examples 1 and 2 and Comparative Examples 1 and 2. These amounts of the variation of flatness were all calculated in a region within a 142 mm square. Furthermore, a positive value for the amount of the variation of flatness indicates a change in surface shape in the direction of a convex shape, while a negative value indicates a change in surface shape in the direction of a concave shape.

(1) Amount of the variation of flatness as calculated from a difference in shape obtained by subtracting the shape of the one of the main surfaces of a transparent substrate prior to thin film formation from the shape of the surface of a thin film following heating treatment or photo irradiation treatment (2) Amount of the variation of flatness as calculated from a difference in shape obtained by subtracting the shape of one of the main surfaces of a transparent substrate after completely removing a thin film from the shape of the surface of the thin film following heating treatment or photo irradiation treatment (3) Amount of the variation of flatness as calculated from a difference in shape obtained by subtracting the shape of one of the main surfaces of a transparent substrate prior to thin film formation from the shape of one of the main surfaces of the transparent substrate after completely removing the thin film (4) Amount of the variation of flatness as calculated from a difference in shape obtained by subtracting the shape of one of the main surfaces of a transparent substrate prior to thin film formation from the shape of the surface of a thin film prior to heating treatment or photo irradiation treatment (5) Amount of the variation of flatness as calculated from a difference in shape obtained by subtracting the shape of the surface of a thin film prior to heating treatment or photo irradiation treatment from the shape of the surface of the thin film following heating treatment or photo irradiation treatment

TABLE 1

| | Amount of the variation of flatness [μm] | | | | | Hydrogen content of transparent substrate [molecules/cm³] |
|---|---|---|---|---|---|---|
| | (1) | (2) | (3) | (4) | (5) | |
| Example 1 | −0.020 | −0.033 | 0.023 | 0.566 | −0.568 | $2.0 \times 10^{17}$ |
| Example 2 | −0.026 | 0.037 | −0.025 | 0.565 | −0.574 | $2.0 \times 10^{17}$ |
| Comparative example 1 | 0.122 | 0.029 | 0.112 | 0.578 | −0.460 | $7.4 \times 10^{18}$ |
| Comparative example 2 | −0.137 | −0.028 | −0.131 | 0.565 | −0.697 | $7.4 \times 10^{18}$ |

As can be seen from the results shown in Table 1, the amount of the variation of flatness as calculated from a difference in shape obtained by subtracting the shape of the one of the main surfaces of a transparent substrate prior to thin film formation from the shape of one of the main surfaces of the transparent substrate exposed after completely removing the thin film in Example 1 was 0.023 μm (indicating a slight change in surface shape in the direction of a convex shape due to heating treatment), and was not more than 100 nm in terms of the absolute value thereof.

In contrast, the amount of the variation of flatness as calculated from a difference in shape obtained by subtracting the shape of one of the main surfaces of a transparent substrate prior to thin film formation from the shape of one of the main surfaces of the transparent substrate exposed after completely removing the thin film in Comparative Example 1 was 0.112 μm (indicating a considerable change in surface shape in the direction of a convex shape due to heating treatment), and was not not more than 100 nm in terms of the absolute value thereof.

The amount of the variation of flatness as calculated from a difference in shape obtained by subtracting the shape of one of the main surfaces of a transparent substrate prior to thin film formation from the shape of one of the main surfaces of the transparent substrate exposed after completely removing the thin film in Example 2 was −0.025 μm (indicating a slight change in surface shape in the direction of a concave shape due to photo irradiation treatment), and was not more than 100 nm in terms of the absolute value thereof.

In contrast, the amount of the variation of flatness as calculated from a difference in shape obtained by subtracting the shape of one of the main surfaces of a transparent substrate prior to thin film formation from the shape of one of the main surfaces of the transparent substrate exposed after completely removing the thin film in Comparative Example 2 was −0.131 μm (indicating a considerable change in surface shape in the direction of a concave shape due to photo irradiation treatment), and was not not more than 100 nm in terms of the absolute value thereof.

It is preferable to use "(2) Amount of the variation of flatness as calculated from a difference in shape obtained by subtracting the shape of one of the main surfaces of a transparent substrate after completely removing a thin film from the shape of the surface of the thin film following heating treatment or photo irradiation treatment" as an indicator in order to more accurately specify film stress of a thin film formed on a transparent substrate. However, there is the problem of having to remove the thin film in order to use this amount of the variation of flatness as an indicator. This need to remove the thin film is eliminated if "(1) Amount of the variation of flatness as calculated from a difference in shape obtained by subtracting the shape of the one of the main surfaces of a transparent substrate prior to thin film formation from the shape of the surface of a thin film following heating treatment or photo irradiation treatment" is used as an indicator for specifying film stress of a thin film.

The difference between the amount of the variation of flatness of (1) and the amount of the variation of flatness of (2) is excessively large in the mask blanks of Comparative Example 1 and Comparative Example 2 due to the large changes in the shapes of the main surfaces of the substrate following heating treatment or photo irradiation treatment. Consequently, the amount of the variation of flatness of (1) cannot be applied as an indicator for specifying film stress. In contrast, since the changes in the shapes of the main surfaces of the substrate following heating treatment or photo irradiation treatment are small in the mask blanks of Example 1 and Example 2, the difference between the amount of the variation of flatness of (1) and the amount of the variation of flatness of (2) is extremely small. Consequently, there are no problems in terms of practical use of the mask blanks of Example 1 and Example 2 even if the amount of the variation of flatness of (1) is applied as an indicator for specifying film stress.

BRIEF DESCRIPTION OF THE REFERENCE SYMBOLS

71 Main surfaces
72 Lateral surfaces
73 Chamfered surfaces

The invention claimed is:

1. A method of manufacturing a mask blank provided with a thin film on a transparent substrate, comprising:
   a step of preparing a transparent substrate having a pair of opposing main surfaces that is composed of a glass material having a hydrogen content of not more than $-2.0 \times 10^{17}$ molecules/cm³,
   a step of forming a thin film composed of a material containing at least one of silicon and metal on one of the main surfaces of the transparent substrate, and
   a step of carrying out heating treatment or photo irradiation treatment on the transparent substrate on which the thin film has been formed; wherein,
   the absolute value of a variation of flatness in a predetermined region, as calculated based on a difference in shape obtained from the shape of one of the main surfaces of the transparent substrate prior to forming the thin film and the shape of one of the main surfaces of the transparent substrate exposed after removing the thin film, is not more than 100 nm.

2. The method of manufacturing a mask blank according to claim 1, wherein a thin film is not formed on the other main surface of the transparent substrate.

3. The method of manufacturing a mask blank according to claim 1, wherein the step of forming the thin film includes the formation of a thin film on one of the main surfaces of the transparent substrate using a sputtering method.

4. The method of manufacturing a mask blank according to claim 1, wherein the heating temperature of the heating treatment is not less than 300° C.

5. The method of manufacturing a mask blank according to claim 1, wherein the photo irradiation treatment is a treatment for irradiating a transparent substrate on which a thin film is formed with light emitted from a flash lamp.

6. The method of manufacturing a mask blank according to claim 1, wherein the glass material is synthetic quartz glass.

7. The method of manufacturing a mask blank according to claim 1, wherein the thin film is composed of a material containing a transition metal and silicon.

8. The method of manufacturing a mask blank according to claim 1, wherein the thin film has internal stress of not more than 360 MPa.

9. A method of manufacturing a transfer mask, comprising: a step of forming a transfer pattern on the thin film of a mask blank manufactured with the manufacturing method described in claim 1.

* * * * *

UNITED STATES PATENT AND TRADEMARK OFFICE
CERTIFICATE OF CORRECTION

PATENT NO. : 9,664,997 B2
APPLICATION NO. : 14/440661
DATED : May 30, 2017
INVENTOR(S) : Atsushi Kominato et al.

It is certified that error appears in the above-identified patent and that said Letters Patent is hereby corrected as shown below:

Column 22, Line 40, in Claim 1, delete "-2.0×10$^{17}$" and insert -- 2.0×10$^{17}$ --

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*